United States Patent
Chakravarthi et al.

(10) Patent No.: US 7,670,892 B2
(45) Date of Patent: Mar. 2, 2010

(54) NITROGEN BASED IMPLANTS FOR DEFECT REDUCTION IN STRAINED SILICON

(75) Inventors: Srinivasan Chakravarthi, Murphy, TX (US); Pr Chidambaram, Richardson, TX (US); Rajesh Khamankar, Coppell, TX (US); Haowen Bu, Plano, TX (US); Douglas T. Grider, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 717 days.

(21) Appl. No.: 11/268,040

(22) Filed: Nov. 7, 2005

(65) Prior Publication Data

US 2007/0105294 A1   May 10, 2007

(51) Int. Cl.
   *H01L 21/336*  (2006.01)
   *H01L 21/8234* (2006.01)

(52) U.S. Cl. .................. 438/197; 438/311; 438/663; 257/E21.17; 257/E21.051; 257/E21.32; 257/E21.267; 257/E21.277; 257/E21.311; 257/E21.421

(58) Field of Classification Search .............. 438/197, 438/300, 301, 311, 510, 513, 51, 663, 680, 438/786
   See application file for complete search history.

(56) References Cited

U.S. PATENT DOCUMENTS

| | | | |
|---|---|---|---|
| 5,413,949 A * | 5/1995 | Hong | 438/197 |
| 5,792,699 A * | 8/1998 | Tsui | 438/290 |
| 5,885,861 A | 3/1999 | Gardner et al. | |
| 6,800,887 B1 | 10/2004 | Weber et al. | |
| 7,307,273 B2 * | 12/2007 | Currie | 257/18 |
| 7,335,545 B2 * | 2/2008 | Currie | 438/197 |
| 2002/0151099 A1 | 10/2002 | Irino | |
| 2005/0094299 A1 | 5/2005 | Tokizono et al. | |
| 2005/0116360 A1 | 6/2005 | Huang et al. | |

* cited by examiner

*Primary Examiner*—David Nhu
(74) *Attorney, Agent, or Firm*—Jacqueline J. Garner; Wade J. Brady, III; Frederick J. Telecky, Jr.

(57) ABSTRACT

A transistor is fabricated upon a semiconductor substrate, where the yield strength or elasticity of the substrate is enhanced or otherwise adapted. A strain inducing layer is formed over the transistor to apply a strain thereto to alter transistor operating characteristics, and more particularly to enhance the mobility of carriers within the transistor. Enhancing carrier mobility allows transistor dimensions to be reduced while also allowing the transistor to operate as desired. However, high strain and temperature associated with fabricating the transistor result in deleterious plastic deformation. The yield strength of the silicon substrate is therefore adapted by incorporating nitrogen into the substrate, and more particularly into source/drain extension regions and/or source/drain regions of the transistor. The nitrogen can be readily incorporated during transistor fabrication by adding it as part of source/drain extension region formation and/or source/drain region formation. The enhanced yield strength of the substrate mitigates plastic deformation of the transistor due to the strain inducing layer.

7 Claims, 2 Drawing Sheets

NITROGEN BASED IMPLANTS FOR DEFECT REDUCTION IN STRAINED SILICON

FIELD OF INVENTION

The disclosure herein relates generally to semiconductor technology, and more particularly to utilizing nitrogen to adapt substrate yield strength.

BACKGROUND OF THE INVENTION

It can be appreciated that several trends presently exist in the electronics industry. Devices are continually getting smaller, faster and requiring less power, while simultaneously being able to support and perform a greater number of increasingly complex and sophisticated applications. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source while providing increased computational speed and storage capacity to store and process data, such as digital audio, digital video, contact information, database data and the like.

Accordingly, there is a continuing trend in the semiconductor industry to manufacture integrated circuits (ICs) with higher device densities. To achieve such high densities, there has been and continues to be efforts toward scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing or 'packing' more circuits on a semiconductor die and/or more die per semiconductor wafer, for example.

One basic building block in semiconductor technology is the metal oxide semiconductor (MOS) transistor. MOS transistors are generally formed upon a semiconductor substrate 12, such as silicon, for example (FIG. 1). Such transistors 10 generally comprise source 14 and drain 16 regions formed within the semiconductor substrate 12, and a channel region 18 defined between the source 14 and drain 16 regions within the substrate 12. A gate structure or stack 20 is formed over the channel region 18, where the gate structure 20 comprises a gate dielectric or a thin layer of electrically insulating material 22 and a gate electrode or layer of electrically conductive material 24 overlying the gate dielectric 22. Sidewall spacers 26 reside on lateral edges of the gate structure 20 to facilitate the spacing of extension regions 28 associated with the source 14 and drain 16 regions. The sidewall spacers 26 also serve to protect the sidewalls of the gate structure 20. The channel region 18 has an associated length "L", while the extent to which the transistor 10 extends transverse to the channel 18 is referred to as the transistor width "W".

To activate the transistor 10, a bias (voltage) is applied to the gate electrode 24 to cause a current to flow within the channel 18. It can be appreciate that the amount of current developed for a given bias voltage is a function of the width-to-length ratio (W/L) of the transistor 10 as well as the mobility of carriers in the channel 18. For example, current can be more easily developed within the channel 18 when the carriers have a higher mobility. This allows for faster circuit operation and/or operations at lower bias voltages (to conserve power), for example. However, as dimensions are reduced to increase packing densities, the transistor width "W" and/or the channel length "L" are reduced. Reducing these dimensions can lead to various performance issues, such as slower transistor operations (e.g., reduced switching speeds, etc.).

Accordingly, a technique would be desirable that facilitates device scaling while promoting carrier mobility.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The disclosure herein relates to enhancing or otherwise adapting the yield strength or elasticity of a substrate upon which a transistor is formed. The yield strength of the substrate is adapted by incorporating nitrogen into the substrate, and more particularly into source/drain extension regions and/or source/drain regions of the transistor. The nitrogen can be readily incorporated into the substrate during transistor fabrication by adding it as part of source/drain extension region formation and/or source/drain region formation. A strain inducing layer is formed over the transistor to apply a strain thereto to alter transistor operating characteristics, and more particularly to enhance the mobility of carriers within the transistor. Enhancing carrier mobility allows the transistor to be scaled down in size while also allowing a desired current to be developed in response to an applied bias voltage. The enhanced yield strength of the substrate mitigates plastic deformation of the transistor due to the strain inducing layer.

According to one or more aspects or embodiments of the present invention, a method of forming a transistor is disclosed. The method includes adapting the yield strength of a semiconductor substrate, forming the transistor upon the semiconductor substrate and inducing strain within one or more portions of the transistor.

The following description and annexed drawings set forth certain illustrative aspects and implementations of the principles disclosed herein. These are indicative of but a few of the various ways in which the principles disclosed herein may be employed.

DETAILED DESCRIPTION OF THE INVENTION

Figure 1:
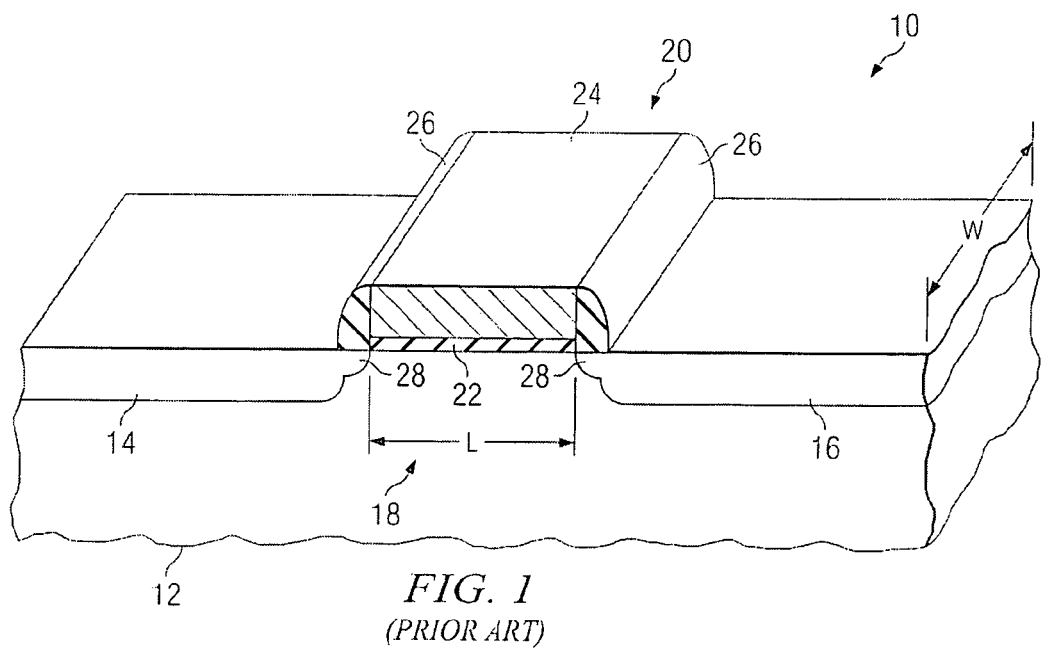
FIG. 1 is a perspective view of a MOS transistor.

One or more aspects or embodiments of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects or embodiments of the present invention. It may be evident, however, to one of ordinary skill in the art that one or more aspects of the invention may be practiced with a lesser degree of these specific details. In other instances, known structures are shown to facilitate describing one or more aspects or embodiments of the present invention.

It will be appreciated that inducing strain within a channel of a MOS transistor promotes carrier mobility, which in turn enhances transistor operations. Accordingly, the disclosure herein provides for forming a layer of strain inducing material over a MOS transistor. However, the implementation of a strain inducing layer can have adverse effects on the transistor. For example, the strain applied to the transistor by the strain inducing layer may exceed the yield strength or elasticity of the substrate upon which the transistor is formed. As such, the substrate can become plastically deformed or damaged such that the transistor operates other than as desired (e.g., as source and drain regions may be "shorted" together). Consequently, the disclosure herein also provides for incorporating nitrogen into the substrate to increase the yield strength of the substrate.

Figure 2:
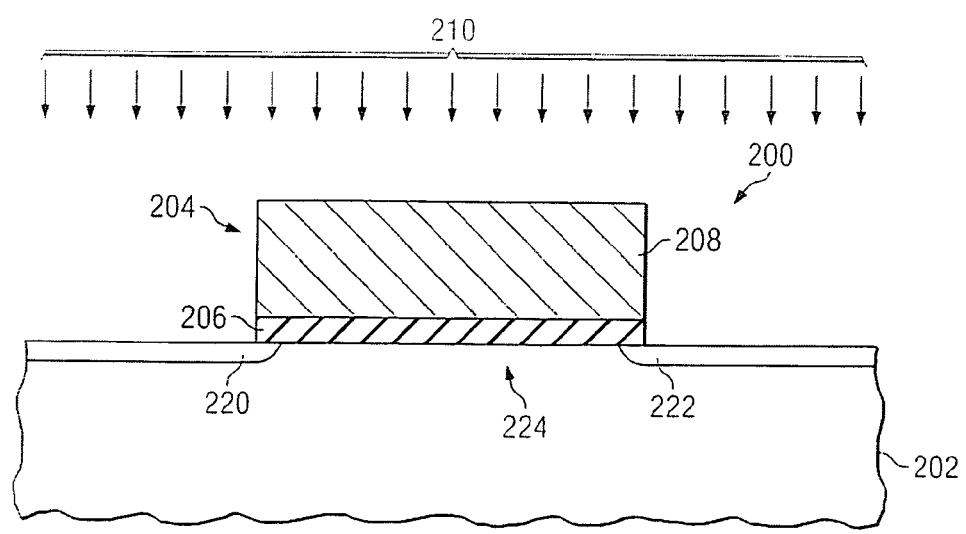
FIG. 2 is a cross sectional view illustrating the formation of a MOS transistor in accordance with the disclosure provided herein.

Turning to FIG. 2, the formation of a MOS transistor 200 in accordance with the disclosure provided herein is illustrated. The transistor 200 is formed upon a semiconductor substrate 202 and includes a gate structure or gate stack 204 formed over the substrate 202. It will be appreciated that 'substrate' as referred to herein may comprise any type of semiconductor body (e.g., silicon, SiGe, SOI) such as a semiconductor wafer or one or more die on a wafer, as well as any other type of semiconductor and/or epitaxial layers associated therewith. The gate structure 204 includes a gate dielectric 206 and a gate electrode 208. The gate structure 204 is formed by forming a layer of electrically non-conductive material over the substrate 202 and forming a layer of electrically conductive material over the layer of electrically non-conductive material. These layers are then patterned to form the gate dielectric 206 and gate electrode 208, respectively.

It will be appreciated that this patterning (as with all masking and/or patterning mentioned herein) can be performed in any suitable manner, such as with lithographic techniques, for example, where lithography broadly refers to processes for transferring one or more patterns between various media. In lithography, a light sensitive resist coating (not shown) is formed over one or more layers to which a pattern is to be transferred. The resist coating is then patterned by exposing it to one or more types of radiation or light which (selectively) passes through an intervening lithography mask containing the pattern. The light causes the exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

The layer of non-conductive material out of which the gate dielectric 206 is formed generally comprises a thin layer of an oxide based material. This layer can be formed by any suitable material formation process, such as thermal oxidation processing, for example, to a thickness of between about 10 Angstroms and about 50 Angstroms, for example, at a temperature of between about 600 degrees Celsius and about 1100 degrees Celsius, for example, in the presence of $O_2$, for example. The layer of electrically conductive material out of which the gate electrode 208 is formed generally comprises a polysilicon based material. This layer can, for example, be formed to a thickness of between about 800 and about 5000 Angstroms, and may include a dopant, such as a p-type dopant (Boron) or n-type dopant (e.g., Phosphorus), depending upon the type of transistor being formed.

With the patterned gate structure 204 formed, an implantation process 210 is performed to form a source extension region 220 and a drain extension region 222 within the substrate 202 on either side of the gate structure 204. It will be appreciated that offset spacers (not shown) may be implemented on the sides of the gate structure 204 to protect the gate structure sidewalls and to guide the implants. By way of example only and not limitation, a p-type dopant (e.g., boron) having a concentration of between about 1E19 to 1E21 atoms/cm3 for a PMOS transistor, or an n-type dopant (e.g., phosphorous) having concentration of about 1E19 to 1E21 atoms/cm3 for an NMOS transistor can be implanted to a depth of between about 150 Angstroms and about 350 Angstroms, for example, to establish the extension regions 220, 222. A channel region 224 is thereby defined within the substrate 202 between the extension regions 220, 222 and below the gate structure 204. It will be appreciated that a thermal process such as a rapid thermal anneal may be performed to activate the extension region dopants, causing them to diffuse laterally slightly under the gate stack 204.

Nitrogen may also be implanted into the substrate 202 at this juncture, either as part of the source/drain extension region implantation process 210 or as a separate process before or after the formation of the source extension 220 and drain extension 222 regions. For example, the nitrogen gas and the dopant gas(es) utilized to establish the extension regions 220, 222 may be ionized separately (in the same or different ionization chambers) and then implanted into the substrate 202 via separate ion beams.

Figure 3:
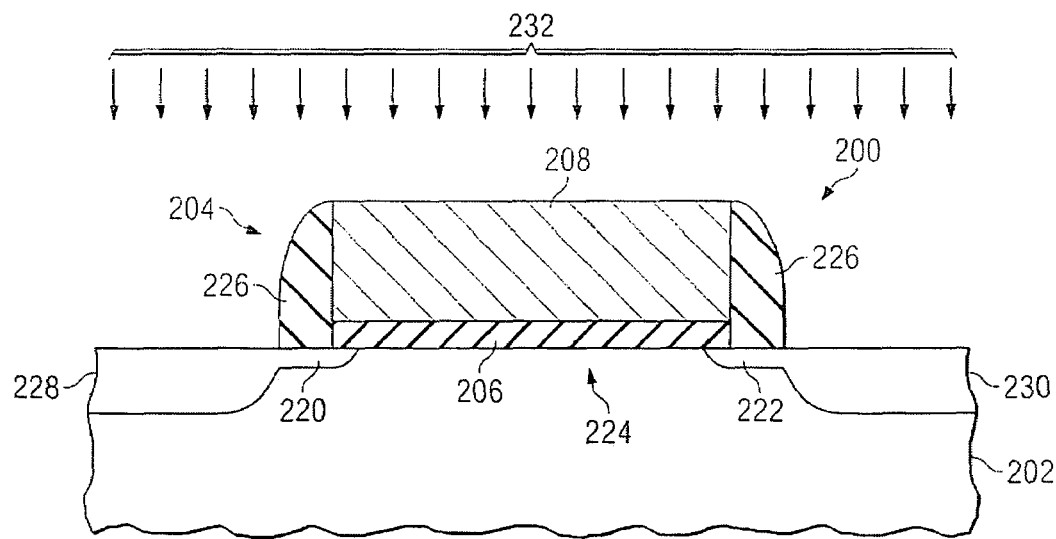
FIG. 3 is another cross sectional view illustrating the formation of a MOS transistor in accordance with the disclosure provided herein.

Sidewall spacers 226 are then formed on lateral edges of the gate structure 204 (FIG. 3). The sidewall spacers 226 comprise an insulating material such as oxide and/or nitride based materials. The spacers 226 are formed by depositing one or more layers of such material(s) over the device in a generally conformal manner, followed by an anisotropic etch thereof, thereby removing the spacer material from the top of the gate structure 204 and the substrate 202, while leaving a region on the lateral edges of the gate structure 204. The sidewall spacers can have a thickness of between about 300 Angstroms and about 700 Angstroms, for example, and thereby offset subsequently formed source/drain regions from lateral edges of the gate structure 204.

Source 228 and drain 230 regions are then formed within the substrate 202 by an implantation process 232. By way of example only and not limitation, a p-type dopant (e.g., boron) having a concentration of between about 1e19 and 5e21 for a PMOS transistor, or an n-type dopant (e.g., phosphorous) having concentration of between about 1e19 and 5e21 for an NMOS transistor can be implanted to a depth of between about 300 Angstroms and about 1500 Angstroms, for example, to establish the source 228 and drain 230 regions.

Instead of, or in addition to, incorporating nitrogen into the substrate 202 when the extension regions 220, 222 are formed, nitrogen can be added to the substrate 202 at this juncture. The nitrogen can be added as part of the implantation process 232 for forming the source 228 and drain 230 regions. For example, the nitrogen gas and the dopant gas(es) utilized to establish the source 228 and drain 230 regions may be ionized separately (in the same or different ionization chambers) and then implanted into the substrate 202 via separate ion beams.

In any event, the nitrogen is implanted such that peak range of the implant damage in the semiconductor substrate 202 from the nitrogen falls somewhere between about one quarter of the peak range of the implant damage in the semiconductor substrate 202 from the source 228 and/or drain 230 implants and about an end of range (EOR) of damage to the semiconductor substrate from the source 228 and/or drain 230 implants. For example, if Arsenic is implanted at an energy of about 40 keV to establish source 228 and/or drain 230 regions such that peak range of the implant damage to the lattice structure of the substrate 202 occurs at about 300 Angstroms and the lattice structure is damaged to a depth of about 600 Angstroms, or rather has an EOR of about 600 Angstroms, then the nitrogen is implanted at an energy such that peak range of the implant damage to the lattice structure from the nitrogen falls somewhere between about one quarter of the 300 Angstroms and about 600 Angstroms, or between about 75 Angstroms and about 600 Angstroms.

The nitrogen is also implanted at a dose of between about one quarter the dose utilized to form the source 228 and/or drain 230 regions and about the dose utilized to form the source 228 and/or drain 230 regions. For example, if a dose of Arsenic of 2E15 atoms per square centimeter is utilized to form the source 228 and/or drain 230 regions, then the nitrogen would be implanted at a dose of between about one quarter that amount and about that amount, or between about 1E15 atoms per square centimeter and about 2E15 atoms per square centimeter. It is to be appreciated that the nitrogen implant can be any ionized form that can introduce nitrogen (e.g., atomic (N), molecular ($N_2$), or other cluster/molecular ions).

Figure 4:
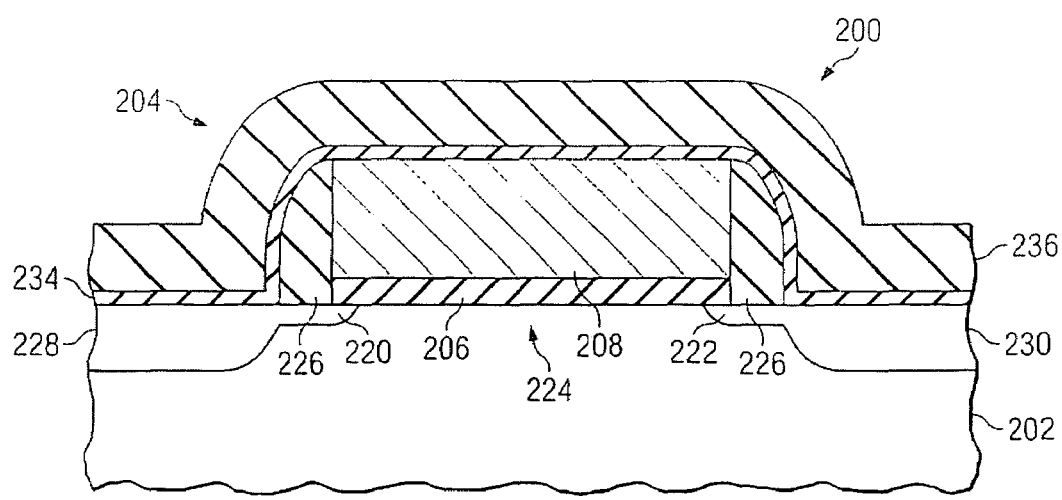
FIG. 4 illustrates in cross section a MOS transistor formed in accordance with the disclosure provided herein.

Once the source 228 and drain 230 regions and the corresponding extension regions 220, 222 have been formed and the nitrogen has been added to the substrate 202, a thin layer of an oxide based material 234 is optionally deposited with a low thermal budget process (e.g., Plasma Enhanced Chemical Vapor Deposition (PECVD)) (FIG. 4). The oxide layer 234 may, for example, be deposited to a thickness of between about 20 Angstroms and about 150 Angstroms. The oxide layer generally serves as an etch stop for the subsequent patterning of a nitride based capping layer.

A layer of strain inducing material 236 is then formed. The strain inducing layer may be formed to a thickness of between about 100 Angstroms and about 1000 Angstroms, for example, and may comprise any suitable strain inducing material, such as oxide, nitride, oxynitride, SiC, SiC0, SiCN, SiOCN, for example. It will be appreciated that the thickness and/or composition of the strain inducing layer may be regulated to control the amount of strain induced by strain inducing layer. An annealing process may also be performed to activate the strain inducing layer 236. By way of example, such annealing may be performed at a temperature of between about 1000 degrees Celsius and about 1100 degrees Celsius with rapid thermal anneal (RTA), and/or at a temperature of between about 1100 degrees Celsius and about 1300 degrees Celsius for about a milli-second with a laser and/or flash lamp, for example.

It will be appreciated that the strain inducing layer 236 facilitates desired operation of the device by serving to increase the mobility of carriers within the transistor. It will also be appreciated that the addition of nitrogen to the transistor 200 serves to increase the elasticity or yield strength of the substrate 202 so that the transistor does not deform in response to the strain applied by the strain inducing layer, and more particularly as a result of the annealing process utilized to activate the strain inducing layer, where such annealing or heating can reduce the yield strength of the substrate 202.

Further processing activities may then be performed, such as annealing the source 228 and/or drain 230 regions followed by removing the strain inducing layer 236. In another example, the strain layer could be selectively etched off from either NMOS or PMOS devices. For example, layer 236 could be etched off PMOS regions so that only NMOS regions have the strain layer. Again, this may be followed by annealing the source 228 and/or drain 230 regions followed by removing the strain inducing layer 236 from the NMOS device. Silicide processing may also be performed wherein a refractory metal material is formed over the transistor 200, followed by thermal processing, wherein metal and silicon interfaces react to form a silicide (e.g., on top of the gate structure 204 and in the source 228 and drain 230 regions). Unreacted metal is then stripped away so that interlayer dielectric and metallization layers can be formed.

It is to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example.

Although the disclosure herein has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as used herein merely means an example, rather than the best.

What is claimed is:

1. A method of forming a transistor, comprising:

adapting a yield strength of a semiconductor substrate, wherein adapting the yield strength comprises incorporating nitrogen into the semiconductor substrate;

forming the transistor upon the semiconductor substrate; and inducing strain within one or more portions of the transistor, wherein inducing strain comprises forming a strain inducing layer over the transistor and annealing the strain inducing layer, wherein at least one of the annealing is performed at a temperature of between about 1000 degrees Celsius and about 1100 degrees Celsius with rapid thermal anneal, and the annealing is performed at a temperature of between about 1100 degrees Celsius and about 1300 degrees Celsius for about a milli-second with a laser or flash lamp anneal.

2. A method of forming a transistor, comprising:

adapting a yield strength of a semiconductor substrate, wherein adapting the yield strength comprises incorporating nitrogen into the semiconductor substrate when at least one of source/drain extension regions of the transistor are formed, and source/drain regions of the transistor are formed;

forming the transistor upon the semiconductor substrate; and inducing strain within one or more portions of the transistor, wherein inducing strain comprises forming a strain inducing layer over the transistor and annealing the strain inducing layer, wherein at least one of the nitrogen is implanted such that peak range of the implant damage to the semiconductor substrate from the nitrogen is between about one quarter of peak range of the implant damage to the semiconductor substrate from source and/or drain dopants and about an End Of Range (EOR) of damage to the semiconductor substrate from source and/or drain dopants, and the nitrogen is implanted at a dose of between about one quarter the dose of the source and/or drain dopants and about the dose of the source and/or drain dopants.

3. The method of claim 2, wherein the nitrogen is implanted at a dose of between about $5 \times 10^{14}$ per square centimeter and about $5 \times 10^{15}$ per square centimeter.

4. A method of forming a transistor, comprising:

forming a gate structure over a semiconductor substrate;

forming source/drain extension regions within the semiconductor substrate, the source extension region and the drain extension region being separated by a channel region within the semiconductor substrate, where the gate structure overlies the channel region;

adding nitrogen to the semiconductor substrate;

forming source/drain implant regions within the semiconductor substrate;

forming a strain inducing layer over the source/drain implant regions and the gate structure; and annealing the strain inducing layer.

5. The method of claim 4, wherein the nitrogen is implanted at a dose of between about one quarter the dose of the source and/or drain dopants and about the dose of the source and/or drain dopants.

6. The method of claim 4, where the nitrogen is added to the substrate after the source/drain implant regions are formed.

7. A method of forming a transistor, comprising:

forming a gate structure over a semiconductor substrate;

forming source/drain extension regions within the semiconductor substrate, the source extension region and the drain extension region being separated by a channel region within the semiconductor substrate, where the gate structure overlies the channel region;

adding nitrogen to the semiconductor substrate;

forming source/drain implant regions within the semiconductor substrate;

forming a strain inducing layer over the source/drain implant regions and the gate structure; and annealing the strain inducing layer, wherein the nitrogen is implanted such that peak implant damage to the semiconductor substrate from the nitrogen is between about one quarter of peak damage to the semiconductor substrate from source and/or drain dopants and about an end of range (EOR) of damage to the semiconductor substrate from the source and/or drain dopants.

* * * * *